(12) United States Patent
Causio et al.

(10) Patent No.: US 8,941,176 B2
(45) Date of Patent: Jan. 27, 2015

(54) INTEGRATED DEVICE WITH RAISED LOCOS INSULATION REGIONS AND PROCESS FOR MANUFACTURING SUCH DEVICE

(75) Inventors: Alessandro Causio, Cambiago (IT); Paolo Colpani, Agrate Brianza (IT); Simone Dario Mariani, Monza (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 323 days.

(21) Appl. No.: 12/893,269

(22) Filed: Sep. 29, 2010

(65) Prior Publication Data

US 2011/0073960 A1 Mar. 31, 2011

(30) Foreign Application Priority Data

Sep. 29, 2009 (IT) ................ TO2009A0737

(51) Int. Cl.
*H01L 29/78* (2006.01)
*H01L 21/8238* (2006.01)
(Continued)

(52) U.S. Cl.
CPC *H01L 21/823878* (2013.01); *H01L 21/823807* (2013.01); *H01L 27/0922* (2013.01); *H01L 29/42368* (2013.01); *H01L 29/66681* (2013.01); *H01L 29/7816* (2013.01); *H01L 29/0653* (2013.01)
USPC ........................... 257/343; 257/335; 438/286

(58) Field of Classification Search
CPC .................... H01L 29/0653; H01L 29/42368; H01L 29/66659; H01L 29/66681; H01L 29/7816; H01L 29/7835; H01L 21/823878; H01L 21/823481; H01L 21/823462; H01L 21/823857

USPC .......... 257/343, 337, 339, 509; 438/425, 442, 438/444, 429, 225, 227, 297, 286, 431, 439
See application file for complete search history.

(56) References Cited

U.S. PATENT DOCUMENTS 4,746,625 A * 5/1988 Morita et al. ................. 438/448
5,681,776 A 10/1997 Herbert et al.
(Continued)

FOREIGN PATENT DOCUMENTS

WO 2006052791 5/2006

OTHER PUBLICATIONS

Search Report for Italian Application No. TO20090737, Ministero dello Sviluppo Economico, Sep. 13, 2010, pp. 3.

(Continued)

*Primary Examiner* — Matthew W Such
*Assistant Examiner* — Scott Stowe
(74) *Attorney, Agent, or Firm* — Gardere Wynne Sewell LLP

(57) ABSTRACT

An embodiment of an integrated device includes a semiconductor body, in which an STI insulating structure is formed, laterally delimiting first active areas and at least one second active area in a low-voltage region and in a power region of the semiconductor body, respectively. Low-voltage CMOS components are housed in the first active areas. Formed in the second active area is a power component, which includes a source region, a body region, a drain-contact region, and at least one LOCOS insulation region, arranged between the body region and the drain-contact region and having a prominent portion that emerges from a surface of the semiconductor body, and an embedded portion inside it. The prominent portion of the LOCOS insulation region has a volume greater than that of the embedded portion.

17 Claims, 7 Drawing Sheets

(51) Int. Cl.
*H01L 27/092* (2006.01)
*H01L 29/423* (2006.01)
*H01L 29/66* (2006.01)
*H01L 29/06* (2006.01)

(56) References Cited

U.S. PATENT DOCUMENTS

| | | | | |
|---|---|---|---|---|
| 5,683,933 | A | * | 11/1997 | Seino ............................ 438/442 |
| 5,834,360 | A | * | 11/1998 | Tesauro et al. ................ 438/445 |
| 6,339,001 | B1 | | 1/2002 | Bronner et al. |
| 6,960,511 | B2 | * | 11/2005 | Ito et al. ........................ 438/289 |
| 7,345,340 | B2 | * | 3/2008 | Hitani et al. .................. 257/335 |
| 2002/0158277 | A1 | | 10/2002 | Harada et al. |
| 2003/0153154 | A1 | | 8/2003 | Uehara et al. |
| 2004/0145027 | A1 | | 7/2004 | Nitta et al. |
| 2004/0251492 | A1 | * | 12/2004 | Lin ............................... 257/335 |
| 2005/0199951 | A1 | | 9/2005 | Shimizu et al. |
| 2006/0086992 | A1 | | 4/2006 | Kang et al. |
| 2006/0138584 | A1 | | 6/2006 | Ko |
| 2006/0148110 | A1 | | 7/2006 | Sung |
| 2007/0138551 | A1 | | 6/2007 | Ko |
| 2008/0006875 | A1 | | 1/2008 | Ohtsuka et al. |
| 2009/0072308 | A1 | | 3/2009 | Chen et al. |
| 2009/0085109 | A1 | | 4/2009 | Izumi |
| 2010/0102388 | A1 | * | 4/2010 | Levin et al. .................... 257/343 |
| 2011/0073945 | A1 | | 3/2011 | Colpani |

OTHER PUBLICATIONS

J. Kim, S. G. Kim, J. G. Koo and D Y. Kim, "p-channel LDMOS transistor using new tapered field oxidation technology", Electronics Letters, 17th Sep. 1998, vol. 34, No. 19, pp. 2.

Search Report for Italian Application No. TO20090738, Ministero dello Sviluppo Economico, Sep. 10, 2010, pp. 3.

* cited by examiner

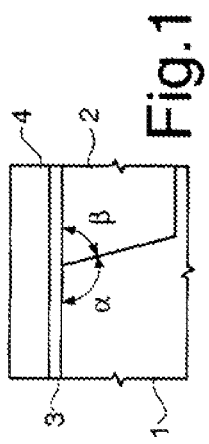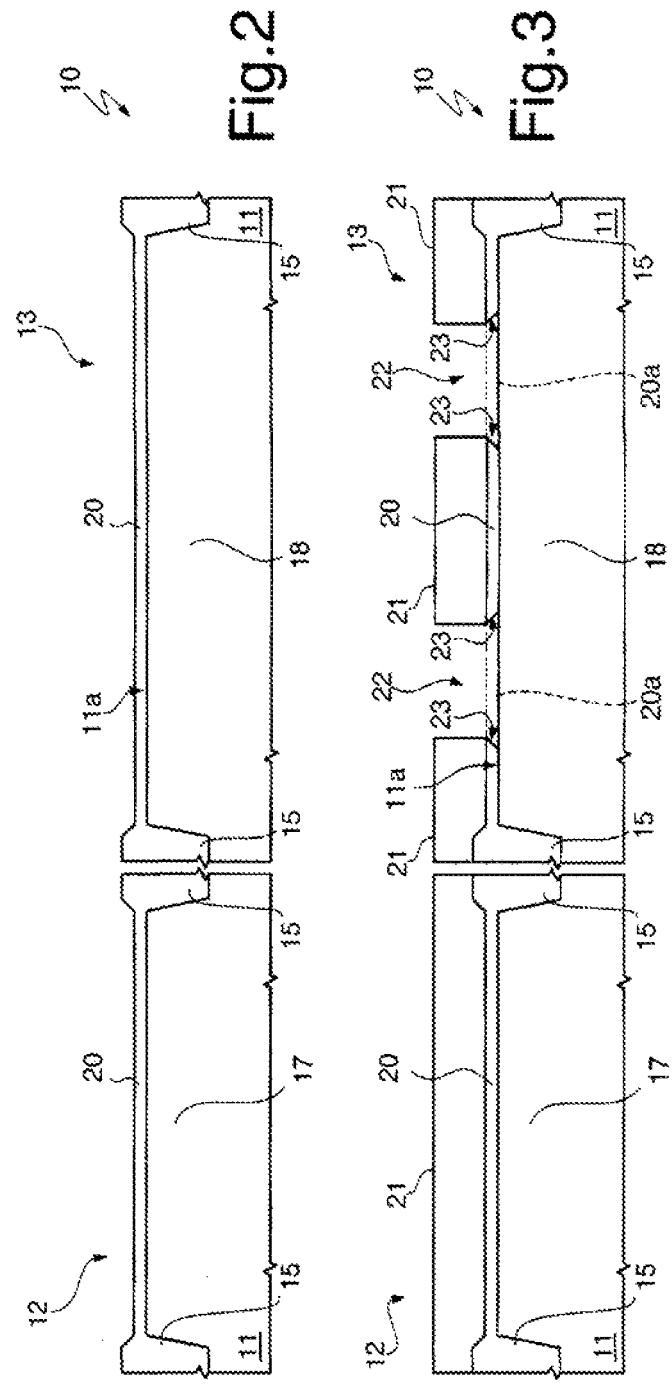

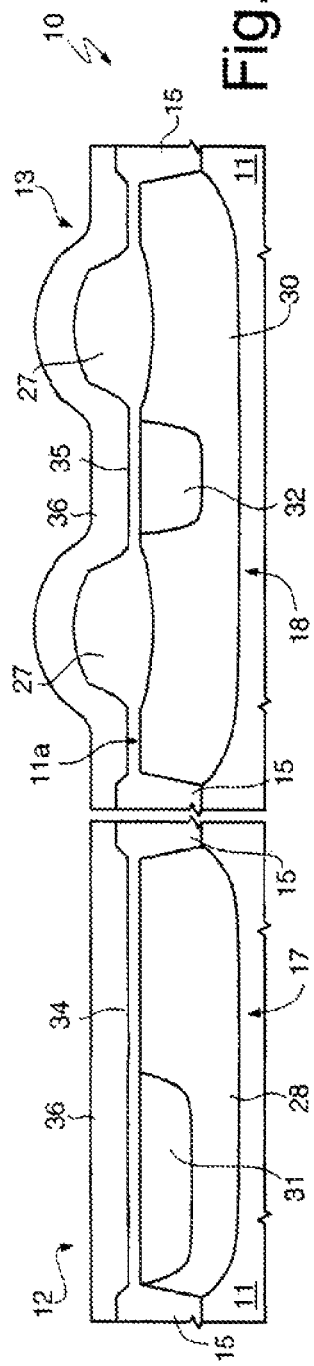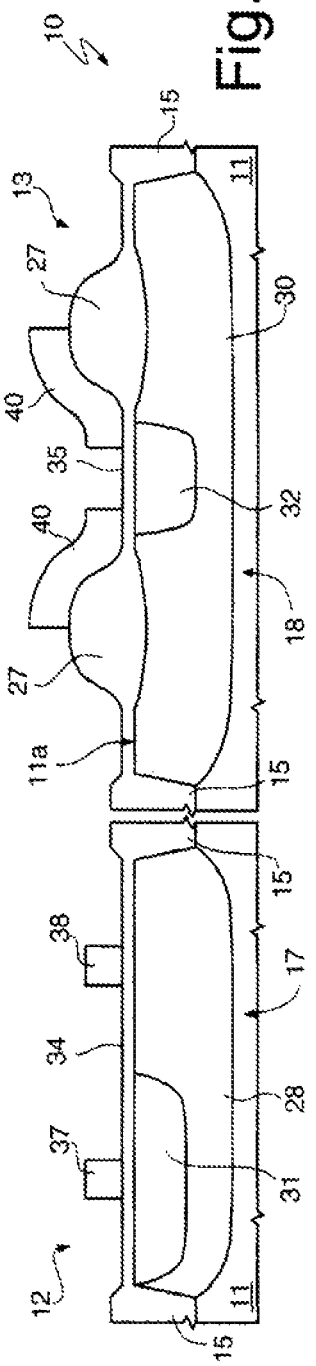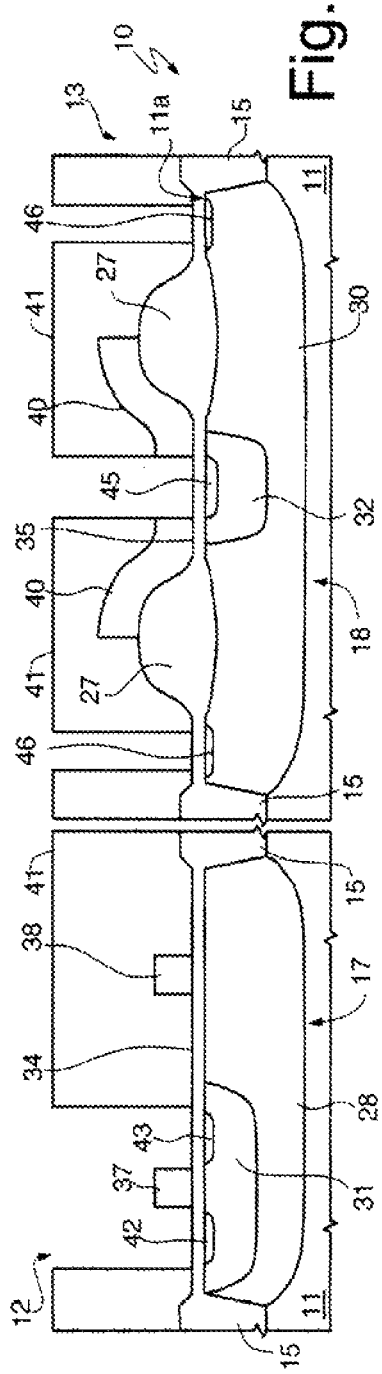

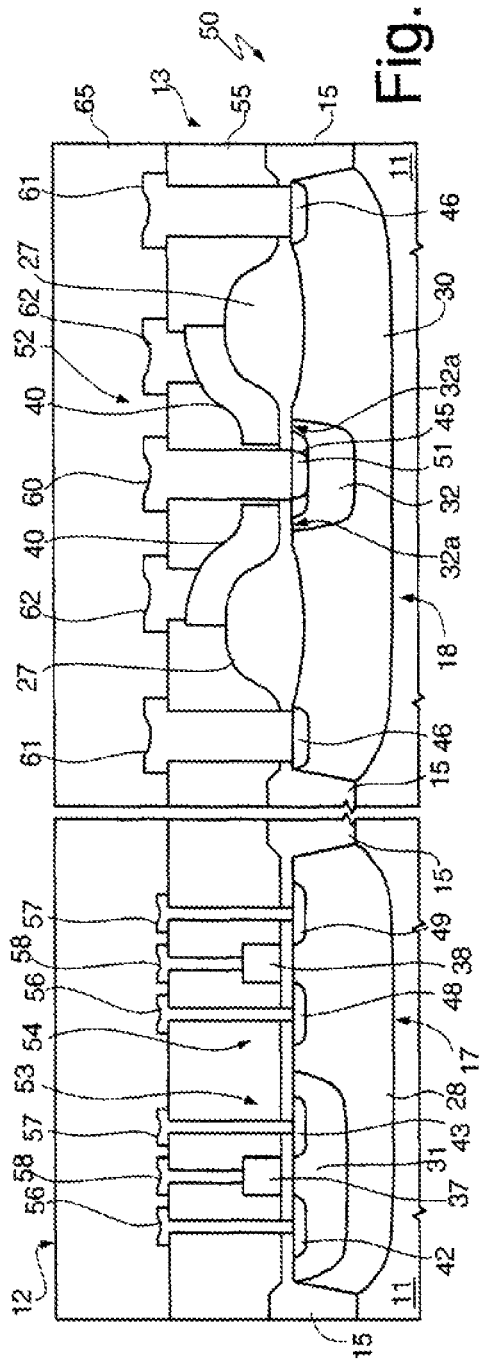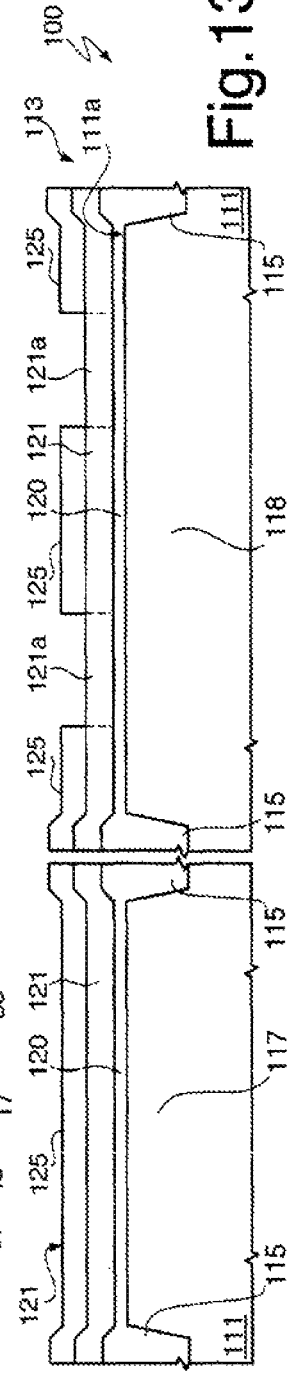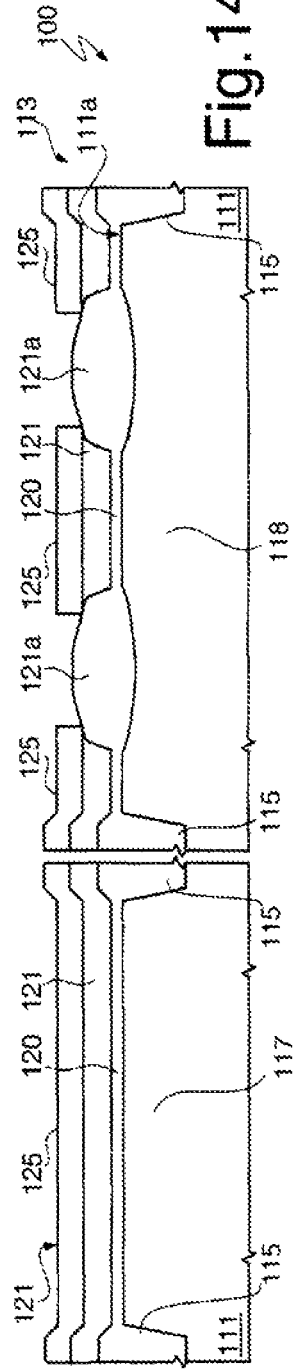

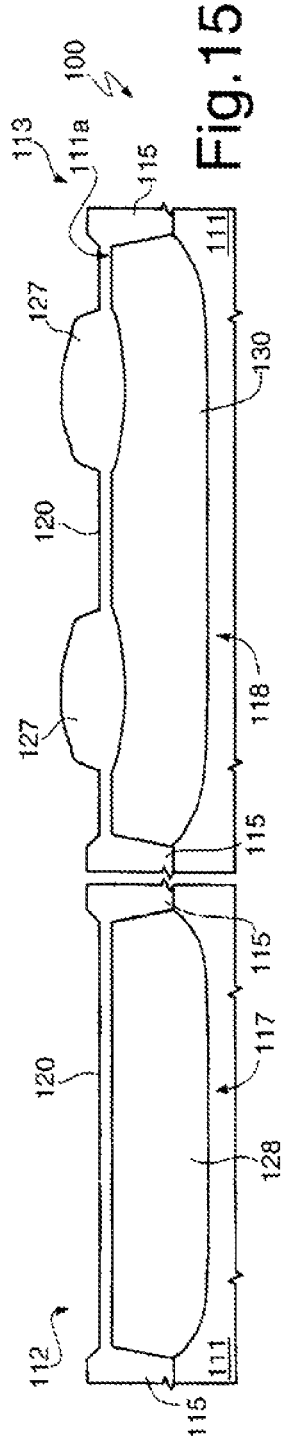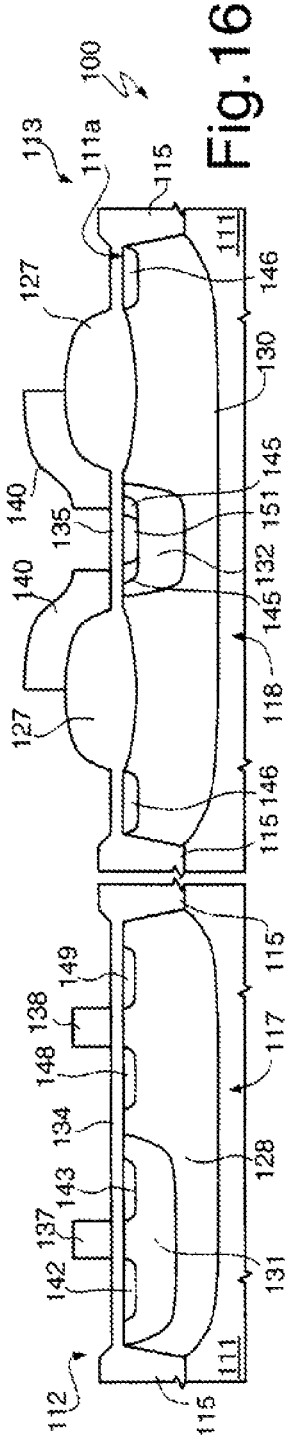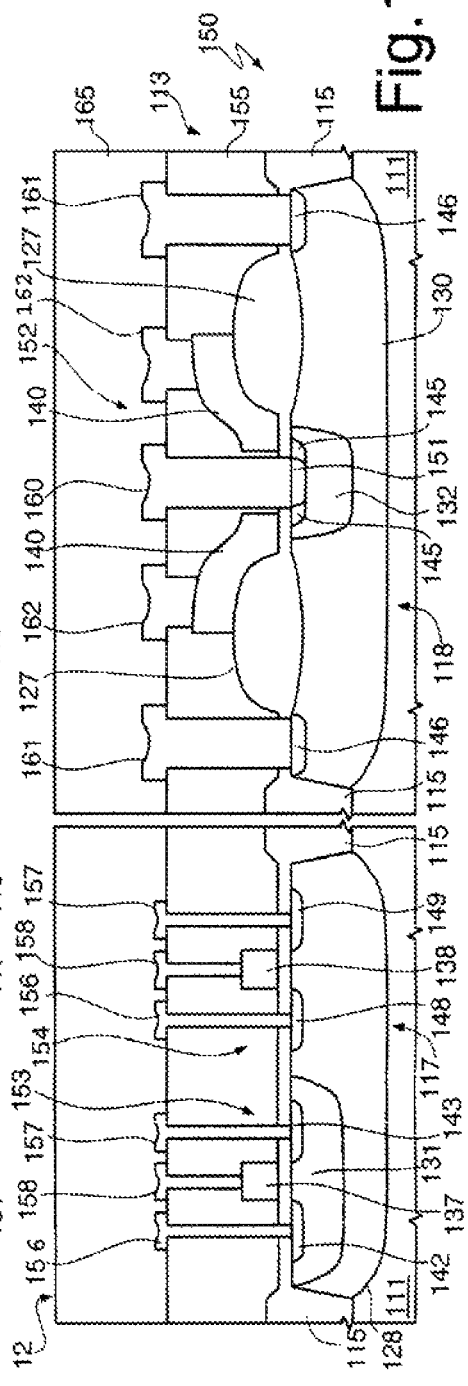

INTEGRATED DEVICE WITH RAISED LOCOS INSULATION REGIONS AND PROCESS FOR MANUFACTURING SUCH DEVICE

PRIORITY CLAIM

The instant application claims priority to Italian Patent Application No. TO2009A000737, filed Sep. 29, 2009, which application is incorporated herein by reference in its entirety.

RELATED APPLICATION DATA

This application is related to U.S. patent application Ser. No. 12/893,219, entitled PROCESS FOR MANUFACTURING AN INTEGRATED DEVICE WITH "DAMASCENE" FIELD INSULATION, AND INTEGRATED DEVICE MADE BY SUCH PROCESS filed Sep. 29, 2010, now U.S. Pat. No. 8,338,888, issued Dec. 25, 2012; which application is incorporated herein by reference in its entirety.

TECHNICAL FIELD

An embodiment of the present disclosure relates to an integrated device with raised LOCOS insulation regions and a process for manufacturing said device.

BACKGROUND

As is known, for numerous applications of microelectronics, there has risen the need to integrate in a single semiconductor chip low-voltage devices and power devices (which operate with voltages that range from approximately 15 V up to beyond 1000 V). In particular, it has become increasingly frequent to make low-voltage devices by CMOS technology in a first portion of the chip and power devices, compatible with the CMOS technology, in a second portion of the same chip. The active areas that house the various devices, both low-voltage devices and power devices, are insulated from one another by shallow-trench-insulation (STI) technique, which enables an extremely high degree of integration to be achieved, with extremely small overall dimensions, and for this reason is typically used in CMOS technology. In practice, the substrate of a semiconductor wafer is selectively etched through a hard mask, for example a multilayer mask of silicon oxide and silicon nitride, and trenches are formed that delimit and separate active areas for low-voltage devices and active areas for power devices. The trenches are oxidized and completely filled with deposited dielectric, normally silicon oxide. The wafer is then planarized, and the hard mask is thus removed. The active areas are hence separated from one another by insulating structures with practically vertical walls, which extend for a stretch in the substrate.

Manufacture of power devices with CMOS technology, in particular in active areas defined by STI, however, may present limits when the scale of integration is pushed beyond a certain threshold. These limits have become manifest with 0.25-μm technology and even more evident with 0.18-μm technology. As already mentioned, the walls of the STI structures are almost vertical (normally inclined at 80°-90°), to minimize the extension of the areas of transition between thin oxide (gate oxide) and thick oxide, and thus reduce the overall dimensions. The corresponding interface in the silicon hence presents equally marked angles, as is shown in FIG. 1, where/ designates a substrate of semiconductor material, in which an STI structure 2 has been made. The substrate/and the STI structure 2 are overlaid by a gate-oxide layer 3 and by a gate region 4 made of polycrystalline silicon. The angle α formed between the faces of the substrate/respectively contiguous to the STI structure 2 and to the gate-oxide layer 3 is 180°−β, where β is the slope of the walls of the STI structure 2. The angle α is hence approximately 90°-100° and may cause a significant concentration of the electrical-field lines, in particular in the proximity of the region where the channel of the power device is formed. The concentration of the electrical-field lines may have an adverse effect both on the active-state resistance ($R_{ON}$, which may be high and unstable on account of injection of hot carriers) and on the breakdown voltage (BV) of the power components. In effect, there may arise problems of reliability and performance that render incompatible the conventional use of STI to obtain power components integrated with low-voltage CMOS devices.

SUMMARY

Embodiments of the present disclosure include an integrated device and a process for manufacturing said integrated device that enable at least some of the above described limitations to be overcome.

BRIEF DESCRIPTION OF THE DRAWINGS

For a better understanding of the disclosure, at least one embodiment will now be described, purely by way of non-limiting example and with reference to the attached drawings, wherein:

FIG. 1 is a cross section through a conventional integrated device;

FIG. 2 is a cross section through a semiconductor wafer in an initial step of a manufacturing process in accordance with an embodiment;

FIGS. 3-11 are cross sections through the wafer of FIG. 2 in subsequent processing steps;

FIG. 12 is a cross section through an integrated device in accordance with an embodiment, obtained from the wafer of FIGS. 2-11;

FIG. 13 is a cross section through a semiconductor wafer in an initial step of a manufacturing process in accordance with another embodiment;

FIGS. 14-16 are cross sections through the wafer of FIG. 13 in subsequent processing steps;

FIG. 17 is a cross section through an integrated device in accordance with another embodiment, obtained from the wafer of FIGS. 13-16.

DETAILED DESCRIPTION

Figure 4:
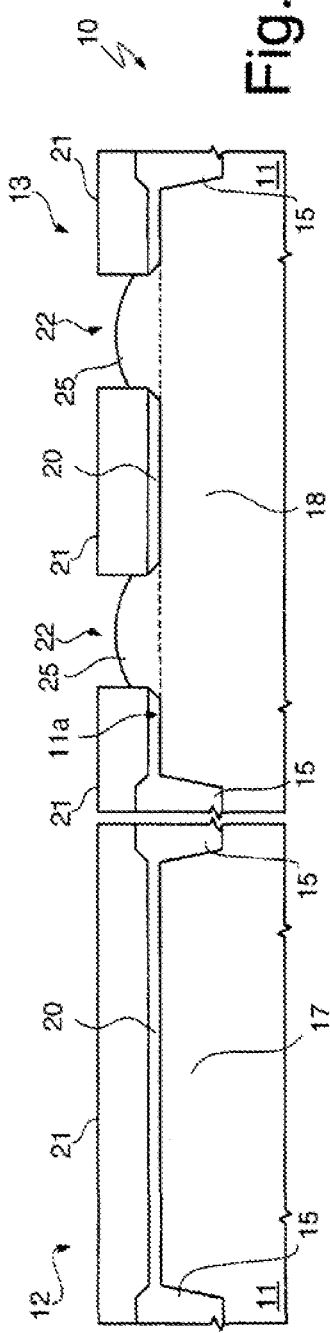

FIG. 2 shows a cross section through a semiconductor wafer, designated as a whole by the reference number 10, which comprises a structural layer, for example a substrate 11 of monocrystalline silicon of a P type, having a surface 11a. In a different embodiment, not illustrated, the structural layer may be an epitaxial layer grown on the substrate 11.

In the substrate 11, a low-voltage region 12 and a power region 13 are defined (which in the annexed figures are not represented in scale, for reasons of simplicity; in particular, the low-voltage region 12 may be enlarged relative to the region 13). In greater detail, in the substrate 11 an STI (shallow-trench isolation) insulation structure 15 has preliminarily been made, which laterally delimits low-voltage active areas 17 (only one of which is shown in FIG. 2, for reasons of simplicity) in the low-voltage region 12 and a power active area 18 in the power region 13. In addition, the low-voltage active areas 17 and the power active area 18 are coated with a pad-oxide layer 20 having a thickness comprised between approximately 10 nm and 60 nm, for example approximately 30 nm.

A dielectric layer, for example silicon nitride, is deposited on the wafer 10 and is shaped to obtain a hard mask 21, as shown in FIG. 3.

The silicon-nitride layer has a thickness comprised between approximately 9 nm and 200 nm and, in an embodiment, equal to approximately 130 nm. The hard mask 21 coats and protects the STI structure 15 and the pad-oxide layer 20 on the low-voltage active areas 17. On the power active areas 18, instead, the hard mask 21 has openings 22 that expose respective portions 20a of the pad-oxide layer 20 (indicated with a dashed line in FIG. 3). The exposed portions 20a of the pad-oxide layer 20 are then selectively etched through the hard mask 21 and removed, exposing the substrate 11. In the embodiment of FIG. 3, the hard mask 21 has two openings 22, which are arranged symmetrically with respect to the power active area 18. In addition, in the embodiment illustrated in FIG. 3, there is also carried out an isotropic etch of the pad-oxide layer 20, which is partially removed underneath the dielectric layer 21 at the sides of the openings 22, to obtain undercuts 23. In an embodiment (not shown), however, the isotropic etch is not performed.

Then (FIG. 4), a selective epitaxial growth is carried out through the hard mask 21, starting from the exposed portions of the substrate 11. In this step, in practice, epitaxial regions 25, of monocrystalline silicon, grow inside the openings 22, filling the undercuts 23, and project and are raised with respect to the surface 11a of the substrate 11. The thickness of the epitaxial regions 25 is determined by controlling the duration of the growth step as a function of the thickness required for the insulation, as clarified hereinafter. In an embodiment, the thickness of the epitaxial regions 25 is approximately 130 nm.

Figure 5:
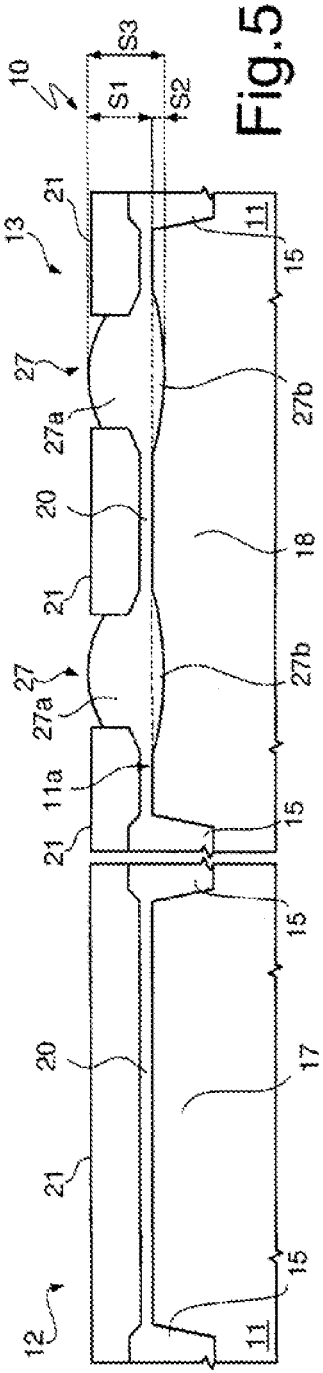

A step of local thermal oxidation (LOCOS) is then carried out, as shown in FIG. 5. The epitaxial regions 25, which are exposed, are selectively oxidized and converted into LOCOS insulation regions 27. Since the thermal oxidation causes an increase in volume, the thickness of the LOCOS insulation regions 27 is greater than the thickness of the epitaxial regions 25 (for example, approximately 300 nm). In addition, the oxidation has a duration such that the LOCOS insulation regions 27 are coupled via the pad-oxide layer 20 and extend in part within the substrate 11, in particular inside the power active region 18. In particular, the duration of the oxidation step is controlled in such a way that prominent portions 27a of the LOCOS insulation regions 27, which project from the surface 11a of the substrate 11, have a greater volume and are thicker than corresponding embedded portions 27b, depressed with respect to the surface 11a. The LOCOS insulation regions 27 may, hence, be more raised from the substrate 11 as compared to LOCOS insulation regions that may be obtained in a conventional way. The ratio between the thickness S1 of the prominent portion 27a and the thickness S2 of the embedded portion 27b of each LOCOS insulation region 27 is determined by the initial thickness of the epitaxial regions 25 and by the duration of the step of thermal oxidation. For example, the thickness 51 of the prominent portion 27a and the thickness S2 of the embedded portion 27b are, respectively, between approximately 70% and 90% and between approximately 10% and 30% of the total thickness S3=S1+S2 of the LOCOS insulation regions 27.

Laterally, the growth of the prominent portions 27a of the LOCOS insulation regions 27 is substantially prevented by the hard mask 21. In addition, the characteristic beaks produced by LOCOS oxidation, albeit present, are much less pronounced in the embedded portions 27b of the LOCOS insulation regions 27, which thus form angles, which may be far from accentuated, at the interface with the power insulation region 18.

Figure 6:
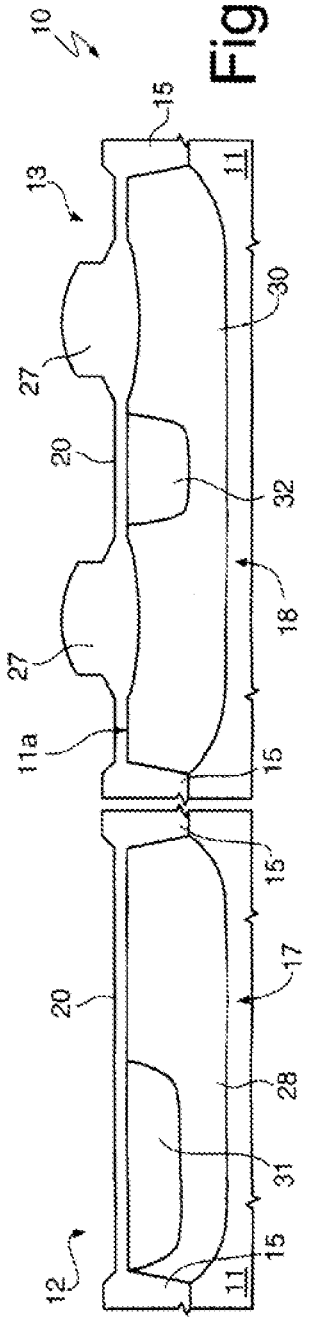

After local thermal oxidation, the hard mask 21 is removed (FIG. 6) and low-voltage N wells 28 are formed, in portions of the low-voltage active regions 17 that are to house NMOS-type transistors (only one of which is illustrated in the attached figures, for reasons of simplicity), and a power N well 30, in the power active region 18. In an embodiment, the power N well 30 is formed in a dedicated implantation step. In an embodiment, the STI structure 15 is provided in this step, precisely after removing the hard mask 21 and prior to forming the low-voltage N wells 28 and the power N well 30.

By a P body implantation and subsequent diffusion, low-voltage body wells 31 are then made in the low-voltage active area 17 and a power body well 32 is made in the power active area 18. The power body well 32 is arranged centrally between the LOCOS insulation regions 27, at a short distance therefrom.

After having formed the low-voltage N wells 28 and the power N well 30, the pad-oxide layer 20 is removed (FIG. 7), and a low-voltage gate-oxide layer 34 is thermally grown on the low-voltage active area 17, and a power gate-oxide layer 35 is thermally grown on the power active area 18. The thermal growth is performed selectively in successive steps in such a way that the thickness of the power gate-oxide layer 35 is greater than the thickness of the low-voltage gate-oxide layer 34. For reasons of simplicity, the difference of thickness is not represented in the figures. Then, a gate polysilicon layer 36 is deposited.

The gate polysilicon layer 36 is then shaped to form low-voltage gate regions 37, 38 and power gate regions 40. The low-voltage gate regions 37, 38 are made on the low-voltage active areas 17, where it is envisaged to make low-voltage CMOS components. In addition, the low-voltage gate regions 37 are made above respective low-voltage body wells 31. The power gate regions 40 in part cover respective LOCOS insulation regions 27 and extend towards one another over the power gate-oxide layer 35 and over the power body well 32, without, however, connecting to one another.

An N+ implant and a P+ implant are then performed.

For the implantation of an N-type dopant species (N+ implant, FIG. 9), a first implantation mask 41 is used, which exposes portions of the low-voltage body wells 31, at the sides of the low-voltage gate regions 37 (in effect, it is the low-voltage gate-oxide layer 34 to be exposed, which, however, is traversed by the implanted species; hence, for reasons of simplicity, in what follows reference will be made to the underlying regions as exposed regions, neglecting the presence of the gate-oxide layers 34, 35 as far as the implantation steps are concerned). In the power region 13, the first implantation mask 41 exposes also the power body well 32 between the power gate regions 40 and the power active area 18, at the sides of the LOCOS insulation regions 27.

In the low-voltage body wells 31, low-voltage source regions 42 and low-voltage drain regions 43 are thus obtained. In the power region 13, a power source region 45 is formed in the power body well 32 and drain-contact regions 46 are formed in the power active area 18, alongside the LOCOS insulation regions 27.

Figure 10:
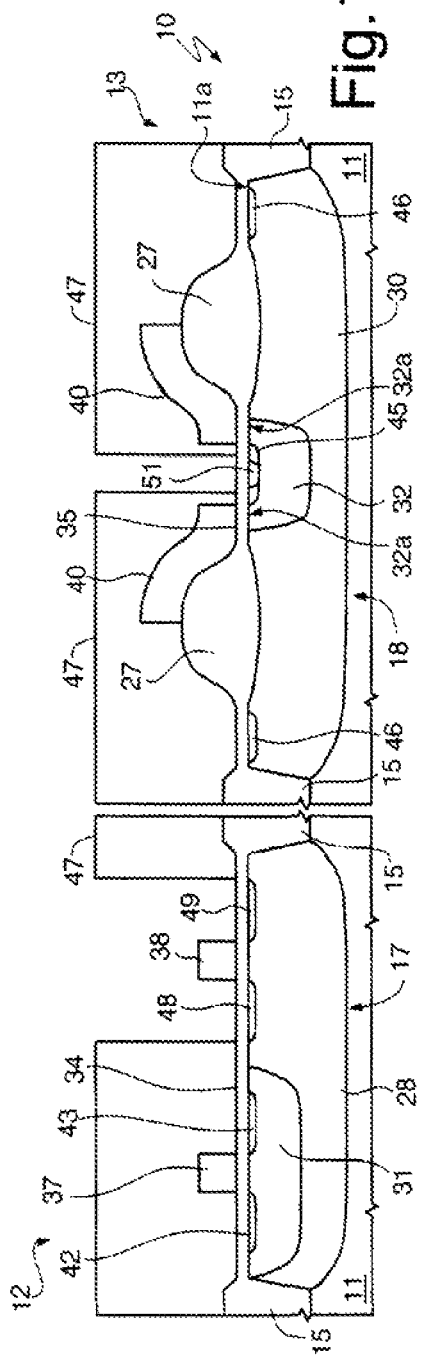

With reference to FIG. 10, for the implantation of a P-type dopant species (P+ implant) a second implantation mask 47 is used, which protects the low-voltage body wells 26 and the power region 13, except for a central portion of the power source region 45, and exposes portions of the substrate 11 in the low-voltage active areas 17 around the low-voltage gate regions 37. Low-voltage source regions 48 and low-voltage drain regions 49 are thus obtained in the low-voltage region 12. In the power region 13, instead, a source-contact region 51 is obtained, which traverses the power source region 45 and reaches the power body well 32.

Figure 11:
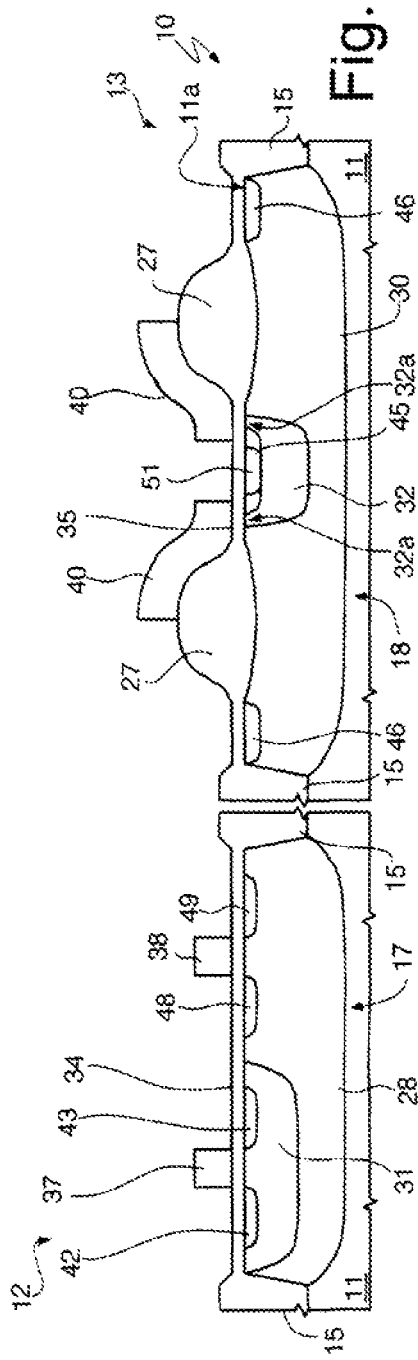

Once the second implantation mask 41 has also been removed, the implanted dopants are thermally diffused (FIG. 11). In this step, in particular, the power source region 45 diffuses underneath the power gate regions 40.

The power gate-oxide layer 35 insulates the power gate region 40 from the power N well 30, from a channel region 32*a* (defined in the power body well 32 at the interface with the power gate-oxide layer 35), and from the power source region 45.

The process is then terminated by contact and protection steps, to obtain an integrated device 50 (shown in FIG. 12), which comprises a power component 52 (in particular, a lateral NMOS transistor) in the power region 13 and low-voltage CMOS components (NMOS transistors 53 and PMOS transistors 54) in the low-voltage region 12.

A first insulating layer 55, for example of silicon oxide, is deposited on the entire wafer 10. Then, a selective etch is performed for opening contact windows in the low-voltage region 12, on the low-voltage source regions 42, 48 and on the low-voltage drain regions 43, 49. Further contact windows are opened on the source-contact region 51 and on the drain-contact regions 46.

In the power region 13, instead, contact windows (not shown either) are opened on the source-contact region 51, on the power gate regions 40, and on the drain-contact regions 46. Then, a metallization layer is deposited and shaped so as to form, in the low-voltage region 12, low-voltage source contacts 56, low-voltage drain contacts 57, and low-voltage gate contacts 58. Obtained in the power region 13 are, instead, a power source contact 60, power drain contacts 61, on the drain-contact regions 46, and power gate contacts 62, on the portions of the power gate regions 40 that lie on the LOCOS insulation regions 27. After forming a second metallization layer (not shown for reasons of simplicity), the wafer 10 is coated with a second protective insulating layer 65 and is cut into dies, each of which incorporates an example of the integrated device 50 shown in FIG. 12.

In an alternative embodiment (not illustrated), further metallization layers and insulating layers may be made prior to the protective layer and dicing of the wafer.

As already mentioned, the integrated device 50 comprises low-voltage CMOS components (e.g., NMOS transistors 53 and PMOS transistors 54), in the low-voltage region 12 and at least one power component 52 (e.g., a lateral NMOS transistor) in the power region 13. The low-voltage CMOS components 53, 54 are obtained in the low-voltage active areas 17. Since the voltages involved in this region are modest, the characteristic STI angles do not pose limitations to proper operation of the CMOS components. In particular, the passage of current underneath the STI structure 15 is prevented.

In the power region 13, instead, the voltages and the electrical field are much higher. However, in the areas subject to higher stress (i.e., the power source region 45, the power body well 32, and the power N well 30, which defines a drain-conduction region of the power component 52), the angles at the interface between the substrate 11 and the LOCOS insulation regions 27 are not very pronounced. The LOCOS insulation regions 27, in fact, are raised and extend mainly above the substrate 11. The thickness required for the insulation is thus achieved without the LOCOS insulation regions 27 penetrating far into the substrate 11. In practice, the LOCOS insulation regions 27 form at the interface with the substrate 11 angles that are smaller not only with respect to the characteristic angles of the STI insulation structures, but also with respect to the structures that may be obtained with conventional LOCOS techniques. Consequently, the distribution of the electrical field may be more homogeneous, and concentrations of field lines may be prevented.

In addition, the length of the current paths between the power source region 45 and the drain-contact regions 46 is limited, because just a small part of the LOCOS insulation regions 27 is immersed in the substrate 11. In this way, factors that limit the performance of the device in terms both of active-state resistance ($R_{ON}$) and of breakdown voltage (BV) may be reduced or eliminated. The power components may be, hence, more reliable and efficient.

In addition, the control of the lateral extension of the LOCOS insulation regions may be very precise due to the use of the selective epitaxial growth through the hard mask and the subsequent thermal oxidation of the epitaxial regions obtained. The lateral dimensions may also be reduced with respect to the use of conventional LOCOS techniques.

An embodiment of the integrated device described and an embodiment of the corresponding production process may thus enable exploitation of the advantages of insulation of an STI type, especially as regards reduction of the area occupied, without, however, incurring in the limitations set by the accentuated angles, typical of STI, to the provision of power components.

A different embodiment of the disclosure is illustrated in FIGS. 13-16.

A semiconductor wafer 100 (FIG. 13) has substantially the structure already illustrated in FIG. 2 and comprises a substrate 111, having a surface 111*a*. In the substrate 111, an STI-type insulation structure 115 has preliminarily been made, which defines a low-voltage region 112 and a power region 113 and delimits low-voltage active areas 117 laterally in the low-voltage region 112 and a power active area 118 in the power region 113. The low-voltage active areas 117 and the power active area 118 are coated with a pad-oxide layer 120 (having a thickness comprised between approximately 10 nm and 100 nm, for example approximately 80 nm).

Deposited on the wafer 100 are a first polysilicon layer or supplier layer 121, for example having a thickness comprised between approximately 50 nm and 200 nm, and a mask layer, for example made of silicon nitride having a thickness of between approximately 10 nm and 100 nm, which is shaped for defining a hard mask 125. On the power active area 118, the hard mask 125 has symmetrical openings 126, which expose portions 121*a* of the supplier layer 121.

A local thermal oxidation (LOCOS) is then carried out using the hard mask 125, as shown in FIG. 14. In this step, the portions 121*a* of the supplier layer 121 exposed by the openings 126 are selectively oxidised. In addition, also the substrate 111 is in part oxidized underneath the openings 126. In this way, LOCOS insulation regions 127 are formed, which extend in part in the substrate 111 and, to a greater extent, thereon. Also in this case, prominent portions 127*a* of the LOCOS insulation regions 127, which project from the surface 111*a* of the substrate 111, are thicker than corresponding embedded portions 127*b*, depressed with respect to the surface 111*a*. The LOCOS insulation regions 127 are hence more raised from the substrate 111 as compared to LOCOS insulation regions that may be obtained in a conventional way. The ratio between the thickness S1' of the prominent portion 127a and the thickness S2' of the embedded portion 127b of each LOCOS insulation region 127 is determined by the initial thickness of the supplier layer 121 and by the duration of the step of thermal oxidation.

The hard mask 125 and the residual portions of the supplier layer 121 are then removed (FIG. 15) and, by an N implantation, low-voltage N wells 128 are provided, in portions of the low-voltage active regions 117 that are to house transistors of an NMOS type (only one of which is illustrated in the attached figures, for reasons of simplicity), and a power N well 130, in the power active region 118.

The process may then proceed as already described previously in conjunction with FIGS. 2-12.

In particular (FIG. 16), by a P body implantation and subsequent diffusion, low-voltage body wells 131 are formed in the low-voltage active area 117 and a power body well 132 in the power active area 118. The power body well 132 is arranged centrally between the LOCOS insulation regions 127, at a short distance therefrom.

The pad-oxide layer 120 is then removed and a low-voltage gate-oxide layer 134 is thermally grown on the low-voltage active area 117, and a power gate-oxide layer 135 is thermally grown on the power active area 118, with differentiated thicknesses.

Then, a gate polysilicon layer (not shown completely) is deposited and shaped for forming low-voltage gate regions 137, 138 (on the low-voltage active areas 117, where it is envisaged to provide low-voltage CMOS components) and power gate regions 140. The power gate regions 140 in part coat respective LOCOS insulation regions 127 and extend towards one another over the power gate-oxide layer 135 and over the power body well 132, without connecting to one another.

N+ and P+ implantations are then performed (the masks are similar to the implantation masks 41, 47 shown in FIGS. 9 and 10 and are not illustrated here, for reasons of simplicity). By the N+ implantation low-voltage source regions 142 and low-voltage drain regions 143 are formed in the low-voltage region 112, and a power source region 145 is formed in the power region 113, inside the power body well 132. In addition, drain-contact regions 146 are formed in the power active area 118, alongside the LOCOS insulation regions 127. The P+ implantation is carried out to obtain low-voltage source regions 148 and low-voltage drain regions 149 in the low-voltage region 112. In the power region 113, instead, a source-contact region 151 is provided, which traverses the power source region 145 and reaches the power body well 132.

The process is terminated, as already described previously, by contact and protection steps, to obtain an integrated device 150 (shown in FIG. 17), which comprises a power component 152 (e.g., a lateral NMOS transistor) in the power region 113 and low-voltage CMOS components (e.g., NMOS transistors 153 and PMOS transistors 154) in the low-voltage region 112.

In particular, after a first insulating layer 155 has been deposited and selectively etched, low-voltage source contacts 156, low-voltage drain contacts 157, and low-voltage gate contacts 158 are made in the low-voltage region 112 from a metallization layer (not shown entirely).

In the power region 113, instead, a power source contact 160 and power drain contacts 161 are formed on the source— and drain-contact regions 151 and 146, and power gate contacts 162 are made on the portions of the power gate regions 140 that lie on the LOCOS insulation regions 127.

After forming a second metallization layer (not shown for reasons of simplicity), the wafer 100 is coated with a second protective insulating layer 165 and is cut into dies, each of which incorporates an example of the integrated device 150, shown in FIG. 17.

The integrated device described may be advantageously used to obtain the control circuitry of devices incorporated in complex systems. Non-limiting examples of use of integrated devices of the type described are found in the control of actuators in particular based upon electric motors (as in the automotive sector, or in the sector of actuators for printers), or else in the control of microelectromechanical systems (MEMS).

Figure 18:
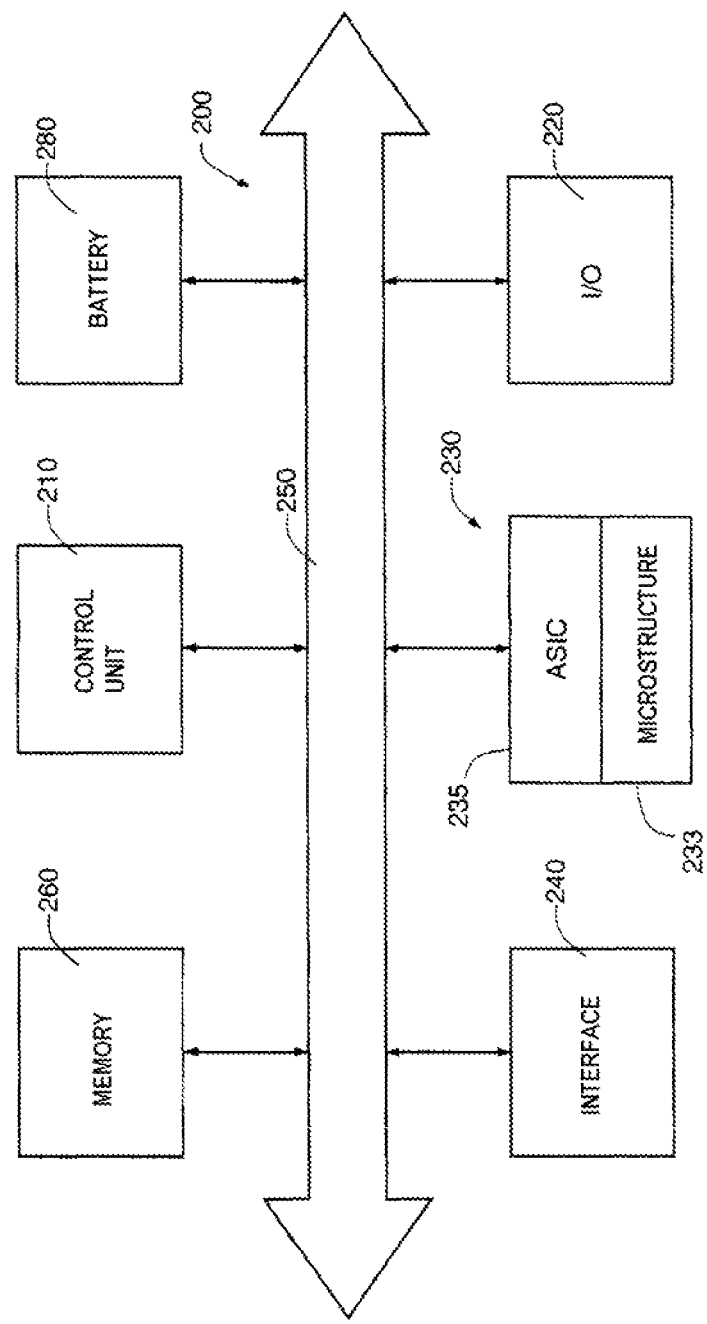
FIG. 18 is a simplified block diagram of an electronic system incorporating an integrated device according to an embodiment.

Illustrated in FIG. 18 is a portion of a system 200 in accordance with an embodiment. The system 200 may comprise a controller 210, an input/output (I/O) device 220 (for example, a keyboard or a display), a microelectromechanical device 230, a wireless interface 240, and a memory 260, of a volatile or nonvolatile type, coupled to one another through a bus 250. In one embodiment, a battery 280 may be used for supplying the system 200. Note that the scope of the present disclosure is not limited to embodiments having necessarily one or all of the devices listed.

The microelectromechanical device 230 comprises a microstructure 233 and an integrated device 235 (ASIC, Application-Specific Integrated Circuit) dedicated to driving and control of the reading microstructure 233 and, possibly, to the detection of quantities measurable by means of the microstructure 233. The integrated device 235 may comprise low-voltage CMOS components and power components integrated in one and the same semiconductor chip and may be made according to what is described with reference to FIGS. 1-12 or, alternatively, according to what is described with reference to FIGS. 13-17.

In an embodiment, the microelectromechanical device 230 is a microelectromechanical sensor, such as for example an accelerometer, a gyroscope, a pressure sensor, a microphone. In a different embodiment, the microelectromechanical device 230 is a microactuator.

The controller 210 may comprise, for example, one or more microprocessors, microcontrollers, and the like.

The I/O device 220 may be used for generating a message. The system 200 may use the wireless interface 240 for transmitting and receiving messages to and from a wireless communications network with a radiofrequency (RF) signal. Examples of wireless interfaces include an antenna, a wireless transceiver, such as a dipole antenna, even though the scope of the present disclosure is not limited from this point of view. In addition, the I/O device 220 may supply a voltage representing what is stored either in the form of digital output (if digital information has been stored) or in the form of analog output (if analog information has been stored).

The system 200 may be, may include, or may be used in apparatuses, such as for example a palmtop computer (personal digital assistant, PDA), laptop or portable computer, possibly with wireless capacity, a cellphone, a messaging device, a digital music player, a digital photographic camera, or other devices.

Finally, it is evident that modifications and variations may be made to the device and to the process described herein, without departing from the scope of the present disclosure.

In the first place, the power component incorporated in the integrated device may have a different arrangement of the drain-contact and gate regions with respect to the source and body regions. In particular, the power component might not be symmetrical, but have only one drain-contact region and only one gate region set on one side of the body well, where the source region is embedded.

The integrated device may moreover comprise an arbitrary number of STI regions coupled to one another or separate from one another. In the same way, the integrated device may comprise an arbitrary number of active areas and of power components.

The implants of an N type or P type to provide the body, source, and drain-contact regions may be performed prior to formation of the STI wells.

Of course, it may be possible to provide devices in which the conductivity of the different regions of semiconductor material is opposite to what has been described.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A semiconductor device, comprising:
   a drain region having a boundary with first and second non coplanar portions;
   a body region disposed in the drain region;
   a source region disposed in the body region;
   a gate insulator disposed over the body region and over the first portion of the boundary;
   a gate region disposed over the gate insulator; and
   a thermally oxidized isolation region disposed over the drain region and over the second portion of the boundary, the oxidized isolation region including a first portion extending into the drain region and a second portion larger than the first portion extending above the drain region.

2. A method, comprising:
   forming a mask over a semiconductor layer;
   forming a first trench in the mask;
   oxidizing a material in the first trench to form a first isolation region that includes a first portion in the first trench and second larger portion above the first trench;
   forming a drain region in the layer beneath the first isolation region;
   forming a body region in the drain region;
   forming a source region in the body region;
   forming a gate insulator over the body region; and
   forming a gate region over the gate insulator.

3. The method of claim 2 wherein forming the mask comprises forming the mask over a pad oxide layer.

4. The method of claim 2 wherein forming the gate region comprises forming the gate region over the first isolation region.

5. The method of claim 2, further comprising:
   forming a second trench in the semiconductor layer;
   forming a second isolation region in the second trench; and
   wherein forming the drain comprises forming the drain adjacent to the second isolation region.

6. The method of claim 5, further comprising forming the second trench and second isolation region before forming the first trench and the first isolation region.

7. The method of claim 5, further comprising forming the second trench and second isolation region after forming the first trench and the first isolation region.

8. The method of claim 2, further comprising:
   forming a second body region in the semiconductor layer;
   forming a second drain region in the second body region;
   forming a second source region in the second body region;
   forming a second gate insulator over the second body region; and
   forming a second gate region over the second gate insulator.

9. The method of claim 8, further comprising forming a second isolation region in the semiconductor layer between the first drain region and the second body region.

10. The method of claim 2 wherein:
    forming the mask comprises forming the mask over a pad oxide layer; and
    forming the first trench comprises exposing a portion of the pad oxide layer through the mask.

11. The method of claim 2 wherein:
    forming the mask comprises forming the mask over a pad oxide layer; and
    forming the first trench comprises:
      exposing a portion of the pad oxide layer through the mask; and
      isotropically etching the exposed portion of a pad oxide layer.

12. The method of claim 2 wherein:
    forming the mask comprises forming the mask over a pad oxide layer; and
    forming the first trench comprises:
      anisotropically etching the mask to expose a portion of the pad oxide layer; and
      isotropically etching the exposed portion of the pad oxide layer.

13. The method of claim 2, further comprising:
    forming a semiconductor material in the first trench; and
    wherein oxidizing the material comprises oxidizing the semiconductor material to form the first isolation region.

14. The method of claim 2, further comprising:
    epitaxially growing a semiconductor material in the first trench; and
    wherein oxidizing the material comprises oxidizing the semiconductor material to form the first isolation region.

15. The method of claim 2, further comprising:
    forming a semiconductor material in the first trench over a portion of a pad oxide layer exposed by the first trench; and
    wherein oxidizing the material comprises oxidizing the semiconductor material to form the first isolation region.

16. The method of claim 2, further comprising:
    epitaxially growing a semiconductor material in the first trench; and
    wherein oxidizing the material comprises oxidizing the semiconductor material and a portion of the semiconductor layer below the semiconductor material to form the first isolation region.

17. The method of claim 2, further comprising:
    forming a semiconductor material in the first trench over a portion of a pad oxide layer exposed by the first trench; and
    wherein oxidizing the material comprises oxidizing the semiconductor material and a portion of the semiconductor layer below the semiconductor material to form the first isolation region.

* * * * *